United States Patent
Zhang et al.

(10) Patent No.: US 11,101,821 B2
(45) Date of Patent: Aug. 24, 2021

(54) METHOD AND DEVICE FOR INCREMENTAL REDUNDANCY HYBRID AUTOMATIC REPEAT REQUEST (IR-HARQ) RE-TRANSMISSION

(71) Applicant: HUAWEI TECHNOLOGIES CO., LTD., Guangdong (CN)

(72) Inventors: Gongzheng Zhang, Hangzhou (CN); Huazi Zhang, Hangzhou (CN); Chen Xu, Hangzhou (CN); Rong Li, Hangzhou (CN); Jun Wang, Hangzhou (CN); Lingchen Huang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 13 days.

(21) Appl. No.: 16/673,421

(22) Filed: Nov. 4, 2019

(65) Prior Publication Data

US 2020/0067532 A1 Feb. 27, 2020

Related U.S. Application Data

(63) Continuation of application No. PCT/CN2017/083330, filed on May 5, 2017.

(51) Int. Cl.
*H03M 13/13* (2006.01)
*H04L 1/18* (2006.01)

(52) U.S. Cl.
CPC .......... *H03M 13/13* (2013.01); *H04L 1/1812* (2013.01)

(58) Field of Classification Search
CPC ... H04L 1/0057; H04L 1/1893; H04L 1/1816; H04L 1/1819; H04L 1/1812; H04L 1/0068; H03M 13/13
See application file for complete search history.

(56) References Cited

U.S. PATENT DOCUMENTS 9,479,292 B2 * 10/2016 Maaref ................ H04L 1/1816
10,756,853 B2 * 8/2020 Zhang .................. H04L 1/0041
(Continued)

FOREIGN PATENT DOCUMENTS

| CN | 1969470 A | 5/2007 |
|---|---|---|
| CN | 101079678 A | 11/2007 |

(Continued)

OTHER PUBLICATIONS

IBM Technical Disclosure Bulletin,"Software-Based Error Control for Personal Systems Communications Links," Apr. 1988, vol. No. 30, Issue No. 11, p. No. 166-171, Apr. 1, 1988 (Year: 1988).*

(Continued)

*Primary Examiner* — Guy J Lamarre

(74) *Attorney, Agent, or Firm* — Womble Bond Dickinson (US) LLP

(57) ABSTRACT

A method for polar encoding includes: receiving a message including information bits; encoding the message using a first polar code to obtain a first codeword; and encoding the message using a second polar code to obtain a second codeword. The second codeword includes two parts, and the first part of the second codeword is same as the first codeword. The method for polar encoding also includes transmitting the first codeword to a receiver in a first transmission; and transmitting the second part of the second codeword in a second transmission without transmitting the first part of the second codeword when the receiver is unable to decode the message based on the first codeword.

20 Claims, 12 Drawing Sheets

(56) References Cited

U.S. PATENT DOCUMENTS

| | | | |
|---|---|---|---|
| 2002/0108086 A1* | 8/2002 | Irvin | H04L 1/0083 714/758 |
| 2002/0114268 A1 | 8/2002 | Kim et al. | |
| 2002/0152342 A1* | 10/2002 | Das | H04L 1/0025 710/117 |
| 2009/0195420 A1* | 8/2009 | Monro | H03M 7/40 341/55 |
| 2009/0313519 A1* | 12/2009 | Nagaraja | H04L 1/1829 714/751 |
| 2011/0126077 A1* | 5/2011 | Park | H04L 1/0077 714/755 |
| 2014/0019820 A1 | 1/2014 | Vardy et al. | |
| 2015/0358113 A1* | 12/2015 | Callard | H04L 1/0041 714/776 |
| 2016/0119266 A1* | 4/2016 | Krishnamurthy | H04L 51/18 709/206 |
| 2017/0012744 A1* | 1/2017 | Shen | H04L 1/0041 |
| 2018/0097580 A1 | 4/2018 | Zhang et al. | |

FOREIGN PATENT DOCUMENTS

| | | |
|---|---|---|
| CN | 101924619 A | 12/2010 |
| CN | 103281166 A | 9/2013 |
| CN | 105453466 A | 3/2016 |
| CN | 105743621 A | 7/2016 |
| CN | 105900365 A | 8/2016 |
| EP | 3113400 A1 | 1/2017 |
| WO | 2015041475 A1 | 3/2015 |
| WO | 2016154972 A1 | 10/2016 |
| WO | 2018072691 A1 | 4/2018 |
| WO | 2018126433 A1 | 7/2018 |

OTHER PUBLICATIONS

R1-1609586 Nokia et al.,"Discussion on the IR-HARQ support of polar codes",3GPP TSG-RAN WG1 #86bis,Lisbon, Portugal, Oct. 10-14, 2016,total 2 pages.

Huazi Zhang et al.,U.S. Appl. No. 62/396,618, filed Provisional App,dated Sep. 19, 2016,total 42 pages.

R1-1611255 Huawei et al: "HARQ scheme for polar codes", 3GPP DRAFT; Nov. 3, 2016 (Nov. 3, 2016), XP051189034,total 26 pages.

Wen Tong et al.,U.S. Appl. No. 62/395,272, filed Provisional App,dated Sep. 15, 2016,total 45 pages.

R1-1611110 ZTE Microelectronics: "HARQ Performance of Rate-compatible Polar codes",3GPP DRAFT; Nov. 13, 2016 (Nov. 13, 2016),XP051175092,total 6 pages.

R1-1705420 Samsung,"Performance evaluation of LDPC Code",3GPP TSG RAN WG1 #88bis,Spokane, WA, Apr. 3-7, 2017,total 29 pages.

IEEE Std 802.11™—2016,"Part 11: Wireless LAN Medium Access Control(MAC) and Physical Layer (PHY) Specifications",IEEE Computer Society,dated Dec. 7, 2016,total 3534 pages.

* cited by examiner

METHOD AND DEVICE FOR INCREMENTAL REDUNDANCY HYBRID AUTOMATIC REPEAT REQUEST (IR-HARQ) RE-TRANSMISSION

CROSS-REFERENCE TO RELATED APPLICATIONS

This application is a continuation of International Application No. PCT/CN2017/083330, filed on May 5, 2017, the disclosure of which is hereby incorporated by reference in its entirety.

TECHNICAL FIELD

The present invention relates generally to a method and device for coding, and, in particular embodiments, to a method and device for incremental redundancy hybrid automatic repeat request (IR-HARQ) re-transmission.

BACKGROUND

Polar codes are linear block error correcting codes that exploit channel polarization to improve overall transmission capacity. In particular, polar codes are designed to transmit information bits over more-reliable bit-channels (e.g., less noisy channels), while transmitting fixed (or frozen) bits over less-reliable bit-channels (e.g., noisier bit-channels). Polar encoding is described in greater detail by the academic paper entitled "Channel Polarization and Polar codes," which is incorporated herein by reference as if reproduced in its entirety.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Hybrid Automatic Repeat Request (HARQ) that combines forward error-correction (FEC) encoding with error control. In particular, redundant information (e.g., FEC bits) are transmitted along with information bits to increase the likelihood that a transmission will be successfully decoded. If the receiver is unable to decode a message after receiving an original transmission, then subsequent re-transmissions are performed until the message is successfully decoded or the maximum re-transmission number is reached. Chase-combing is a HARQ re-transmission technique in which every re-transmission contains the same data (e.g., the same combination of information and parity bits) is re-transmitted until the underlying message is decoded. Incremental redundancy is another HARQ re-transmission technique in which different data (e.g., different combinations of information and parity bits) are re-transmitted until the message is successfully decoded. In general, incremental redundancy provides a better coding gain than chase-combining when implemented as a HARQ re-transmission technique. HARQ technique can apply both in uplink transmission and downlink transmission.

Aspects of this disclosure provide a technique for implementing polar encoding with incremental redundancy HARQ re-transmission. In particular, a transmitter may encode a message using different polar codes to obtain multiple codewords. The first codeword is transmitted in an original transmission. If the message cannot be decoded based on the original transmission, then a second part of a second codeword is transmitted as part of a re-transmission. These and other aspects are discussed in greater detail below.

Figure 1:
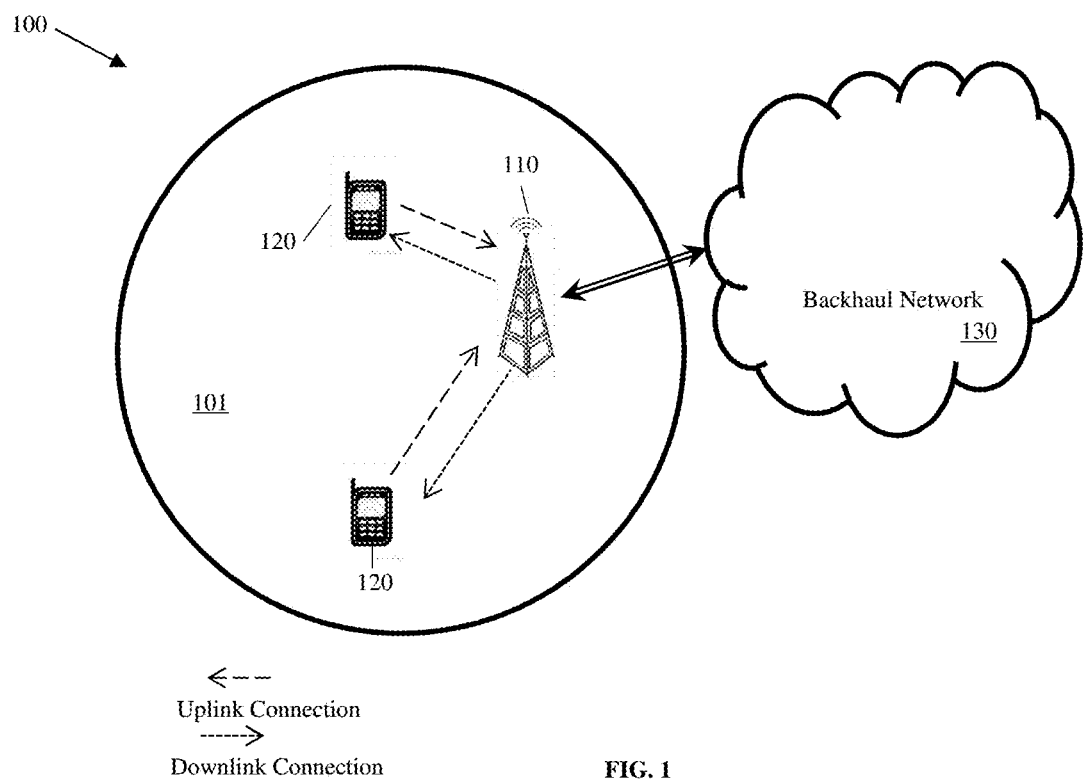
FIG. 1 illustrates a diagram of an embodiment wireless communications network.

FIG. 1 illustrates a network 100 for communicating data. The network 100 comprises a base station 110 having a coverage area 101, a plurality of mobile devices 120, and a backhaul network 130. As shown, the base station 110 establishes uplink (dashed line) and/or downlink (dotted line) connections with the mobile devices 120, which serve to carry data from the mobile devices 120 to the base station 110 and vice-versa. Data carried over the uplink/downlink connections may include data communicated between the mobile devices 120, as well as data communicated to/from a remote-end (not shown) by way of the backhaul network 130. As used herein, the term "base station" refers to any component (or collection of components) configured to provide wireless access to a network, such as an enhanced base station (eNB), a macro-cell, a femtocell, a Wi-Fi access point (AP), or other wirelessly enabled devices. Base stations may provide wireless access in accordance with one or more wireless communication protocols, e.g., long term evolution (LTE), LTE advanced (LTE-A), High Speed Packet Access (HSPA), Wi-Fi 802.11a/b/g/n/ac, etc. As used herein, the term "mobile device" refers to any component (or collection of components) capable of establishing a wireless connection with a base station, such as a user equipment (UE), a mobile station (STA), and other wirelessly enabled devices. In some embodiments, the network 100 may comprise various other wireless devices, such as relays, low power nodes, etc.

Figure 2:
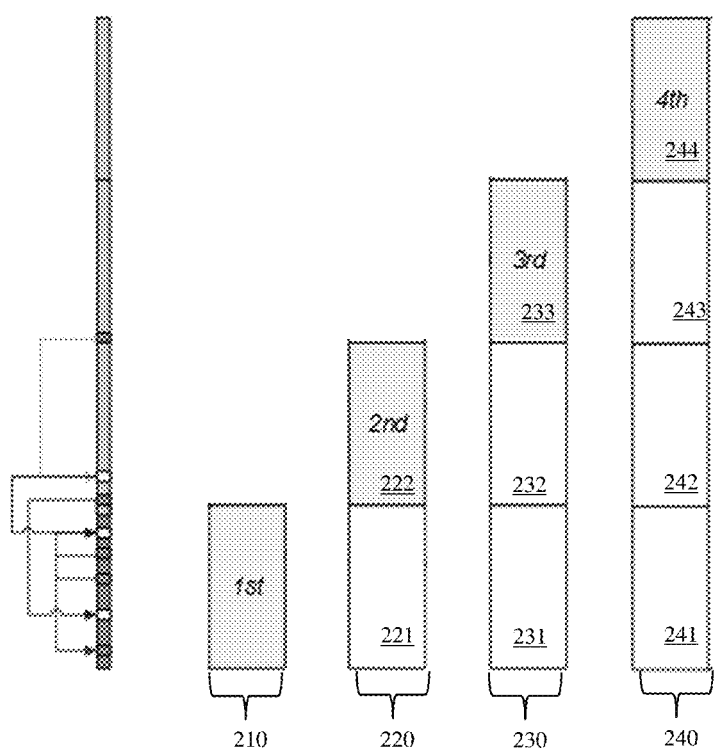
FIG. 2 illustrates a diagram of an incremental redundancy HARQ re-transmission scheme.

Aspects of this disclosure provide techniques for implementing polar encoding with incremental redundancy HARQ re-transmission. FIG. 2 illustrates a diagram of a scheme for implementing polar encoding in incremental redundancy HARQ re-transmission. In this example, a message is encoded using four different polar codes to obtain four codewords 210, 220, 230, 240. As a specific example, the codeword 220 is twice as long as the codeword 210, the codeword 230 is three times as long as the codeword 210, and the codeword 240 is four times as long as the codeword 210. As explained in greater detail below, the codeword 210 is transmitted in an original transmission, the second part 222 of the codeword 220 is transmitted as a first retransmission if the message cannot be decoded based on the original transmission, the last third 233 of the codeword 230 is transmitted as a second re-transmission if the message cannot be decoded following the first retransmission, and the last fourth 244 of the codeword 240 is transmitted as a third re-transmission if the message cannot be decoded following the third retransmission. More generally, the length of each single transmission can be different, i.e., the length of codewords 210, 220, 230, 240 may not be linear.

Although each of the codewords 210, 220, 230, 240 carry the same set of information bit, the distribution of the information bits between the various portions of the respective codewords differs based on the number, and distribution, of frozen bits and parity bits in the codewords 210, 220, 230, 240. In general, the codeword 210 at least partially overlaps with the first part 221 of the codeword 220, the first one third 231 of the codeword 230, and the first one fourth 241 of the codeword 240 such that some of the information bits in the codeword 210 are included in the leading portions of the codewords 220, 230, 240. The degree of overlap (e.g., the number of common information bits) may vary depending on the design and/or code rate of the polar codes used to generate the codewords 210, 220, 230, 240. For example, the codeword 210 overlaps significantly with the first part 221 of the codeword 220 such that many of the information bits in the codeword 210 are present in the first part 221 of the codeword 220, while only a few information bits in the codeword 210 are present in the second part 222 of the codeword 220.

Information bits in the first part 221 of the codeword 220 are generally excluded from the second part 222 of the codeword 220, and vice versa. Likewise, information bits in each third of the codeword 230 are generally excluded from the other two-thirds of the codeword 230, and information bits in each fourth of the codeword 240 are generally excluded from the other three-fourths of the codeword 240. Different subsets of information bits may be included in the second part 222 of the codeword 220, the last third of the codeword 230, and the last fourth 244 of the codeword 240 such that different subsets of bits are transmitted during each re-transmission.

As mentioned above, the codeword 210 is transmitted in the original transmission. If the message cannot be decoded based on the codeword 210, then the second part 222 of the codeword 220 is transmitted as a first re-transmission. The first part 221 of the codeword 220 is not transmitted during the first re-transmission. Upon receiving the first re-transmission, the receiver may attempt to decode the message based on the second part 222 of the codeword 220 and the codeword 210. In some embodiments, the receiver may decode the second part 222 of the codeword 220 and codeword 210 received in the previous reception as one codeword to obtain the all information bits carried by the codeword 220 with a corresponding information bit values obtained from the second part 222 of the codeword 220 and the codeword 210 during a parity check operation. Note that the length of part 221 can be equal or unequal to the length of 222.

If the message cannot be decoded based on the codeword 210 and the second part 222 of the codeword 220, then the last third 233 of the codeword 230 is transmitted as a second re-transmission. The first third 231 and the second third 232 of the codeword 230 are not transmitted during the second re-transmission. Upon receiving the first re-transmission, the receiver may decode the last third 233 of the codeword 230, the second part 222 of the codeword 220 and the codeword 210. The portions 233, 222, and 210 may be combined and decoded together. The receiver may also perform a parity check on the information bit values obtained from the last third 233 of the codeword 230 by the parity check bit values obtained from the codeword 210 and/or the second part 222 of the codeword 220. Note that more generally, the length of part 231, part 232 and part 233 can be equal or unequal.

If the message cannot be decoded following the second retransmission, then the last fourth 244 of the codeword 240 may be transmitted as a third re-transmission. The first fourth 241, the second fourth 242, and the third fourth 244 of the codeword 240 are not transmitted during the third re-transmission. The receiver may decode the fourth re-transmission, and perform a parity check similar to that described above. Again, more generally, the length of part 241, part 242, part 243 and part 244 can be equal or unequal.

Figure 3:
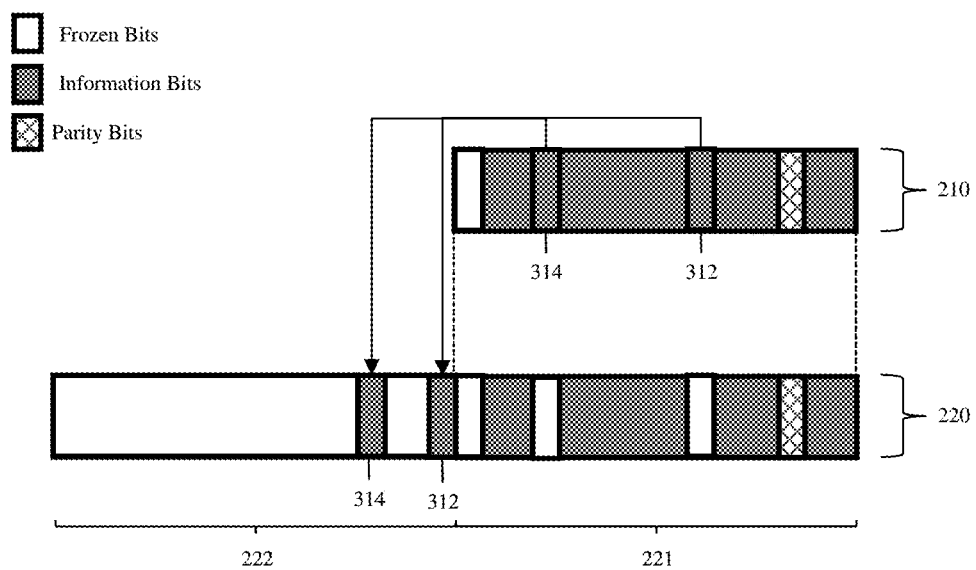
FIG. 3 illustrates a diagram of a codewords from the incremental redundancy HARQ re-transmission scheme depicted in FIG. 2.

FIG. 3 illustrates a diagram of the codewords 210 and 220. As shown, the codewords 210, 220 includes information bits, parity bits, and frozen bits. The first part 221 of the codeword 210 includes all of the information bits in the codeword 210 except for the subset of information bits 312, 314, which are included in the second part 222 of the codeword 220.

Figure 4:
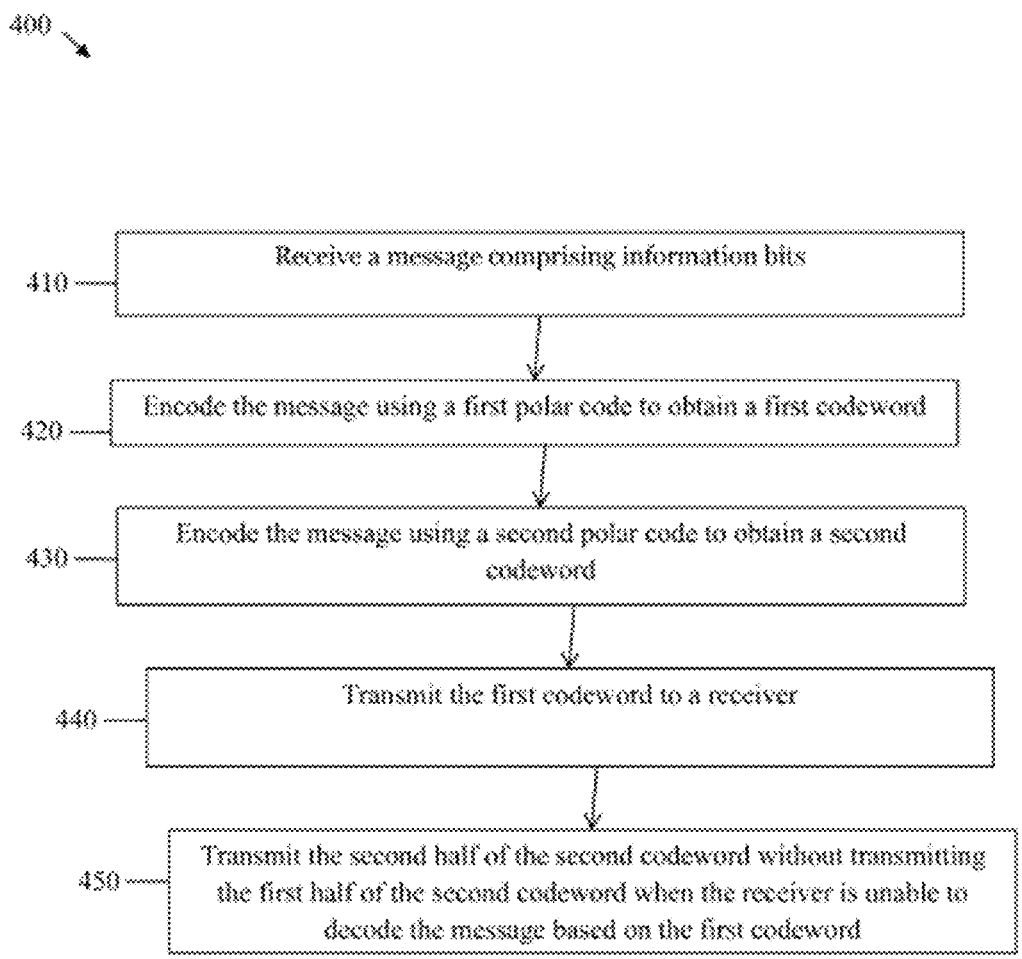
FIG. 4 illustrates a flowchart of an embodiment polar encoding method.

FIG. 4 illustrates a flowchart 400 of a polar encoding method 400 for incremental redundancy HARQ re-transmission, as may be performed by a transmitter. At operation 410, the transmitter receives a message comprising information bits. At operation 420, the transmitter encodes the message using a first polar code to obtain a first codeword. At operation 430, the transmitter encodes the message using a second polar code to obtain a second codeword. At operation 440, the transmitter transmits the first codeword to a receiver. At operation 450, the transmitter transmits the second part of the second codeword without transmitting the first part of the second codeword when the receiver is unable to decode the message based on the first codeword.

Figure 5:
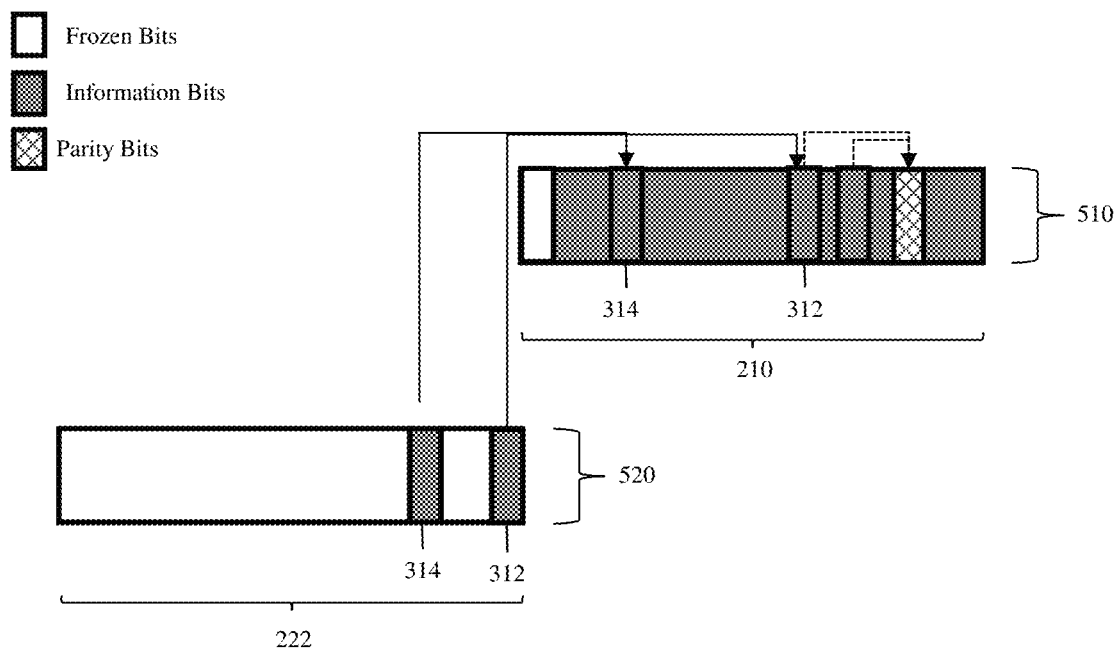
FIG. 5 illustrates a diagram of an original transmission and a re-transmission according to the incremental redundancy HARQ re-transmission scheme depicted in FIG. 2.

FIG. 5 illustrates a diagram of an original transmission 510 and a first re-transmission 520 received by a receiver. The original transmission carries the codeword 210 and the first re-transmission carries the second part 222 of the codeword 220. After receiving the first re-transmission, the receiver attempts to decode the message based on the second part 222 of the codeword 220 and the codeword 210. In one example, the receiver compares the information bit-values for the information bits 312, 314 obtained from the second part 222 of the codeword 220 received during the first re-transmission with the information bit-values for the information bits 312, 314 received during the original transmission as a parity check. Additionally, a parity check may also be performed on information bit values 312, 314 obtained from the first re-transmission and/or the original transmission based on parity bits in the original transmission.

Figure 6:
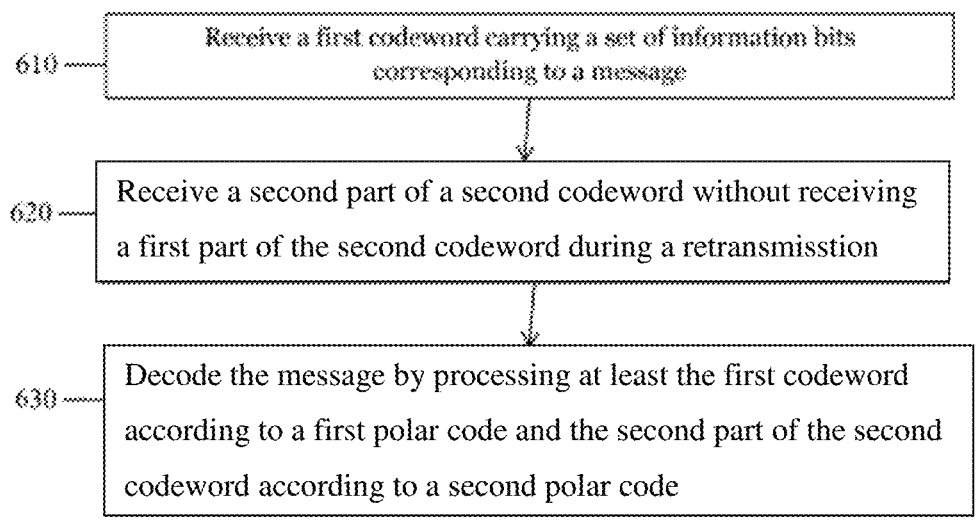
FIG. 6 illustrates a flowchart of an embodiment polar decoding method.

FIG. 6 illustrates a flowchart 600 of a polar decoding method 600 for incremental redundancy HARQ re-transmission, as may be performed by a receiver. At operation 610, the receiver receives a first codeword carrying a set of information bits corresponding to a message. The first codeword is received as part of an original transmission. At operation 620, the receiver receives a second part of a second codeword without receiving a first part of the second codeword. The second part of the second codeword is received as part of a re-transmission. At operation 630, the receiver decodes the message by processing at least the first codeword according to a first polar code and the second part of the second codeword according to a second polar code.

Figure 7:
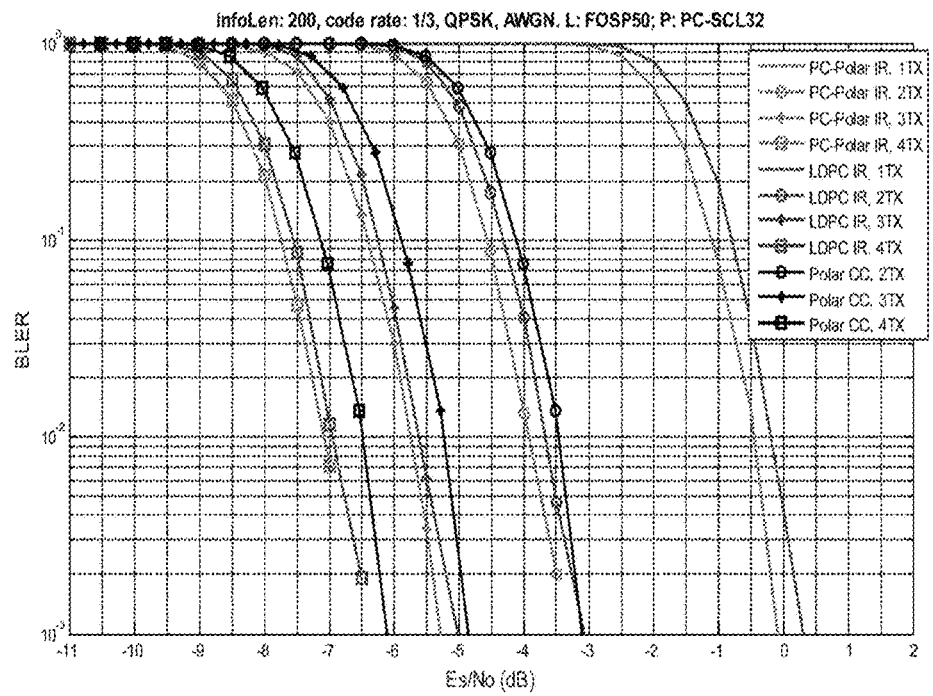
FIG. 7 illustrates a graph comparing the performance of embodiment polar encoding incremental redundancy HARQ re-transmission schemes and LDPC re-transmission schemes.
Figure 8:
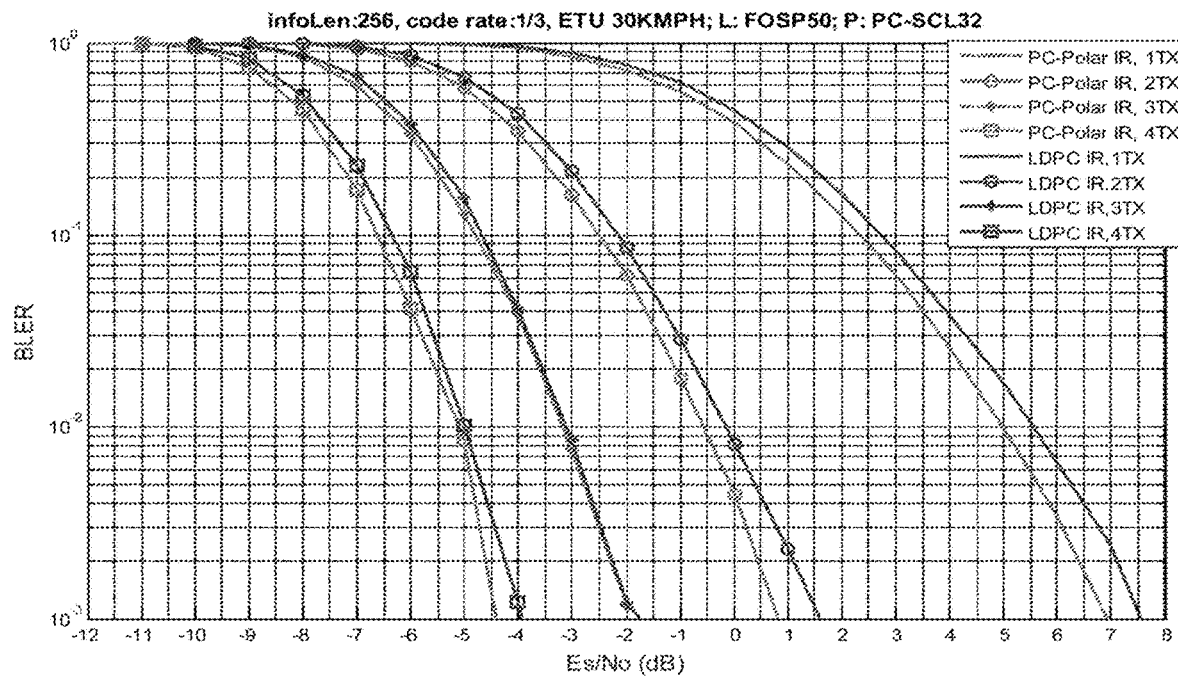
FIG. 8 illustrates another graph comparing the performance of embodiment polar encoding incremental redundancy HARQ re-transmission schemes and LDPC re-transmission schemes.

FIGS. 7 and 8 illustrate graphs comparing the performance for various embodiments with LDPC coding techniques.

Figure 18A:
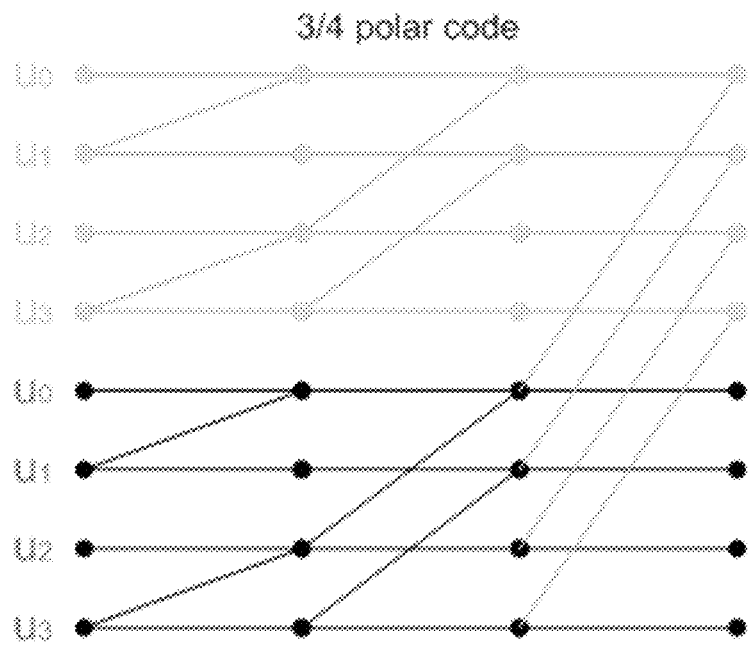
FIGS. 18A and 18B illustrate examples of transmitting polar codes.
Figure 18B:
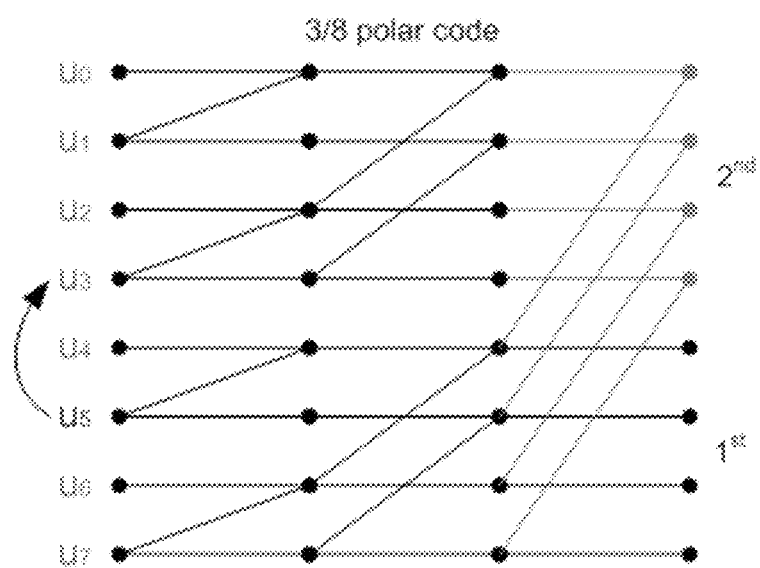

The following is an example of a re-transmission scheme. In the 1st transmission, 3-bit information is encoded into 4-bit codeword (multiplied by a 4×4 Kronecker matrix). The information-bit set is selected as I_1=[1,2,3] as shown in the 1st figure. In the 2nd transmission, the code length is extended to 8, and the 3-bit information is encoded into 8-bit codeword (multiplied by a 8×8 Kronecker matrix). Since the code length is doubled, the information-bit set will be updated to I_1=[5,6,7] (=[1,2,3]+4 as second part or original part of the long code). While, in terms of the long code, the new selected information-bit set is I_2=[3,6,7], where 3 belongs to the first part or extended part of the long code. This means that sub-channel 5 in I_1 is not optimal for the long code but 3 is. So, we need to copy the information bit in 5 to 3 for the long code. Note that this procedure does not change the value of the original part [4,5,6,7]. The combined original and extended parts are encoded into 8-bit codeword (multiplied by a 8×8 Kronecker matrix), and only the first part of the encoded bits will be transmitted in the 2nd transmission (see the 2nd figure). The second part of the encoded bits of the long code are same as the encoded bits in the 1st transmission. This is why we can combine the received LLR of the two transmissions and decode it as a whole codeword. (At the decoder side, u3 will be decoded prior to u5 and u5 will be treated as a parity-check bit.). A diagram of the first transmission is provided in FIG. 18A, and a diagram of the second transmission is provided in FIG. 18B.

When parity check polar codes are used, the retransmission procedures are similar except that parity check functions are introduced into the precoding procedure. Any kind of parity check functions can be applied.

Following details are related to embodiments which use parity check polar codes.

Embodiment 1: Incremental Coded Bits Generation Procedure

Information-bit set $I_t$, frozen-bit set $F_t$, and parity-check (PC)-Frozen-bit $PF_t$, and all sub-channel set $S_t$ in tth transmission. In (t+1)th transmission: If the mother code length is doubled after extending (e.g., from N to 2N), update the indices of $I_t$, $F_t$, $PF_t$, and $S_t$ (add N to all indices).

Operation 1. Determine Information-bit set $I'_{t+1}$, PC-Frozen-bit $PF'_{t+1}$, and Frozen-bit set $F'_{t+1}$ in terms of extended code length and extended sub-channel index set $S_{t+1}$;

E.g., for $1^{st}$ transmission, $S_t=\{1, 2, \ldots, N\}$. For $2^{nd}$ transmission, after code extension, $S_{t+1}=\{1, 2, \ldots, 2N\}$, and $S_t$ will be updated as $S_t=\{N+1, N+2, \ldots, 2N\}$.

Operation 2. Determine the Information-bit set from $I'_{t+1}$ that belongs to the extended part, i.e., in $S_{t+1}$ but not in $S_t$, and mark them as new information-bit set $I_{new}$ of size K'; Determine the PC-Frozen-bit set $PF'_{t+1}$ that belongs to the extended part, i.e., in $S_{t+1}$ but not in $S_t$, and mark them as new PC-Frozen-bit set $PF_{new}$; Determine K' most unreliable sub-channels from $I_t$ that does not belong to $I_{new}$, and mark them as single PC-Frozen-bit set $PF_S$;

Operation 3. Sequentially copy the bits from $PF_S$ to $I_{new}$, i.e., make one-to-one mapping or single parity-check between $I_{new}$ and $PF_S$;

Operation 4. Make parity-check functions for $PF_{new}$ and $I_{new}$ in the way of PC-Polar construction;

Operation 5. Precode and Arikan encode in terms of the extended PC-Polar code, transmit the incremental coded bits (the coded bits corresponding to the original part do not change due to the Arikan kernel.).

Now, for the (t+1)th transmission, the Information-bit set becomes $I_{t+1}=I_{new} \cup I_t$ excluding $PF_S$, the PC-Frozen-bit becomes $PF_{t+1}=PF_t \cup PF_{new} \cup PF_S$, the PC-function includes the ones made according to corresponding to $PF_t \cup PF_{new}$ and the single parity-check functions corresponding to $PF_S$.

Figure 9:
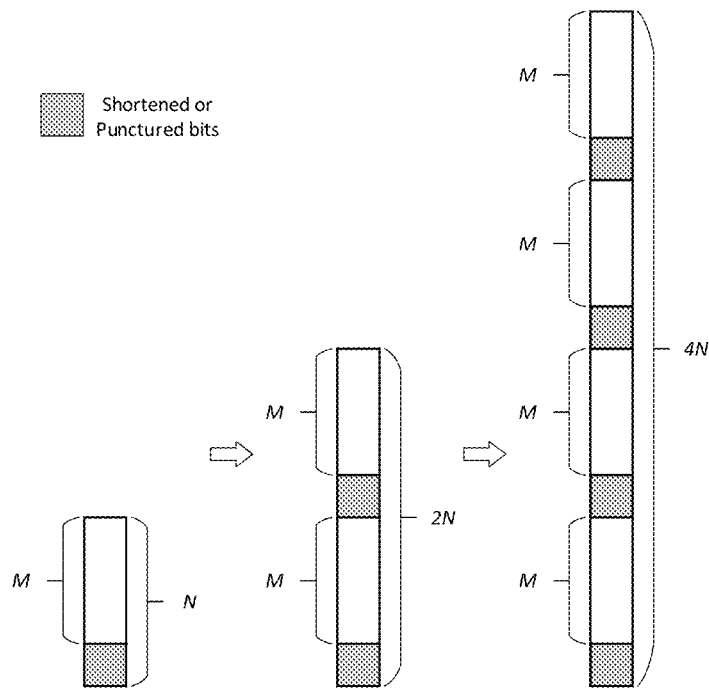
FIG. 9 Symmetrical shortening or puncturing.

Embodiment 2: Fine Granularity Support for IR-HARQ with Symmetrical Rate Matching Pattern The symmetrical rate matching pattern example is shown in FIG. 9. It implies that the shortened/punctured positions in retransmission (from mother code length $2^k*N$ to $2^k*M$) is symmetrical and consistent with the shortened/punctured positions in the initial transmission (from mother code length N to M, where M is the code length of the initial transmission), i.e., the shortened/punctured positions in the second part of the second polar code is symmetrical and consistent with the shortened/punctured positions in the first codeword. E.g., when the pth (N<p≤2N) coded bit is punctured, the (p−N)th coded bit is also punctured. This can be realized as follows.

1) The shortened/punctured positions are determined for the initial ($1^{st}$) transmission with any rate matching method, including QUP and BIV shortening. They are denoted as $\{p_1, p_2, \ldots, p_{N-M}\}$, where M is the code length of the $1^{st}$ transmission, and N is the corresponding mother code length with $N=2^{\lceil log_2 M \rceil}$.
2) In the retransmission, we first extend the code length to $2^k*M$. Here, $k=log_2(\lceil 1+\gamma \rceil)$, where γM is the number of transmitted bits in the retransmission. At the same time, the mother code length will be extended to $2^k*N$.
3) Update the indices of shortened/punctured positions to $\{p_1, p_2, \ldots, p_{N-M}\}+(2^k-1)N$, as the extended part are always put ahead of the original part.
4) Shorten/Puncture the coded bits at positions $\{p_1, p_2, \ldots, p_{N-M}\}+(2^l-1)N$, l=0, 1, …, k−1. Together with the shortened/punctured positions in the initial transmission, the shortened/punctured positions for the extended code will be $\{p_1, p_2, \ldots, p_{N-M}\}+(2^l-1)N, l=0, 1, \ldots, k$, which are symmetric and consistent with the initial transmission.

Note that the length of the second part of the second polar code can be same as the first part or not.

Note that BIV shortening is symmetrical in nature. The shortened positions from N to M is consistent with the shortened positions from $2^k*N$ to $2^k*M$ for any integer k≥0. Therefore, if BIV shortening is used for rate matching for the initial transmission, the rate matching for retransmissions is straightforward.

For the symmetrical rate matching pattern, we will ignore the shortened/punctured positions in the extending process. Especially when shortening is used for rate matching, the shortened bits are known by the sender and receiver, and extending these positions cannot bring any new information. Here, we consider the remaining parts after symmetrical shortening or puncturing.

Figure 10:
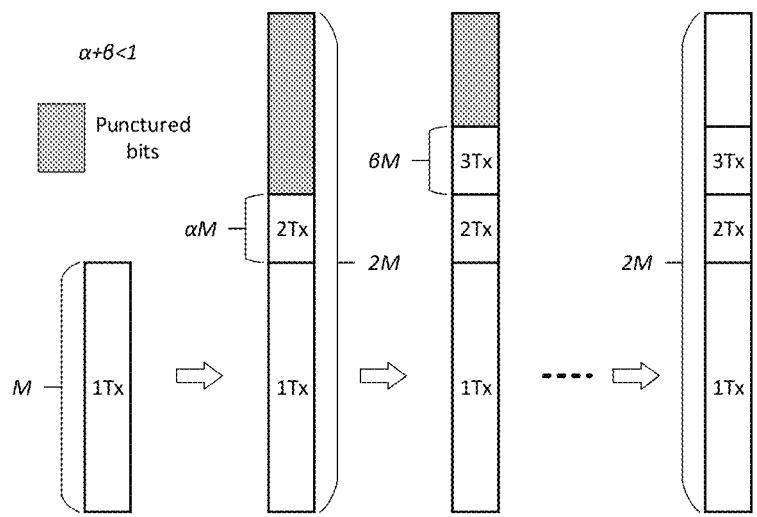
FIG. 10 IR-HARQ process with fine granularity—I.

FIG. 10 presents an IR-HARQ process with arbitrary transmitted bits in each retransmission. In this example, the extended code length is less than twice of the initial transmission after the 2nd and 3rd transmissions. The general procedure is as follows.

1) Extend the code length to the number of total bits transmitted from the initial transmission until this retransmission. In FIG. 10, the code length is extended to $(1+\alpha)M$ in the $2^{nd}$ transmission and $(1+\alpha+\beta)*M$ in the $3^{rd}$ transmission, respectively. It can be seen that the length of transmitted codeword in each transmission can be equal (i.e. $\alpha=\beta=1$) or unequal.
2) Take symmetrical shortening/puncturing from $2k*N$ to $2^k*M$, where $k=\log_2(\lceil 1+\gamma \rceil)$ and $(1+\gamma)M$ is the extended code length. In FIG. 10, the extended code length is less than 2M in the $2^{nd}$ and $3^{rd}$ transmissions. Therefore, the symmetrical shortening/puncturing is done from 2N to 2M.
3) Puncture from head in a sequential order from the resulted positions after 2). In FIG. 10, the 2M coded bits will be punctured to $(1+\alpha)M$ and $(1+\alpha+\beta)M$ for the $2^{nd}$ and $3^{rd}$ transmissions, respectively. These punctured positions will be extended in future transmissions.
4) Construct the Polar code according to the extended polar code. The reliabilities of the sub-channels may be recalculated or not.
5) Shortening and puncturing may be used simultaneously for rate matching in retransmissions. The LLR (log-likelihood ratio) will be set to 0 and infinity for puncturing and shortening at the decoder, respectively.

Embodiment 3: Fine Granularity Support for IR-HARQ with Asymmetrical Rate Matching Pattern In Embodiment 2, the symmetrical shortened/punctured positions are ignored in extending process, which is very appropriate for shortening. This embodiment gives an example where puncturing is used in the initial transmission, especially puncturing sequentially from head.

Figure 11:
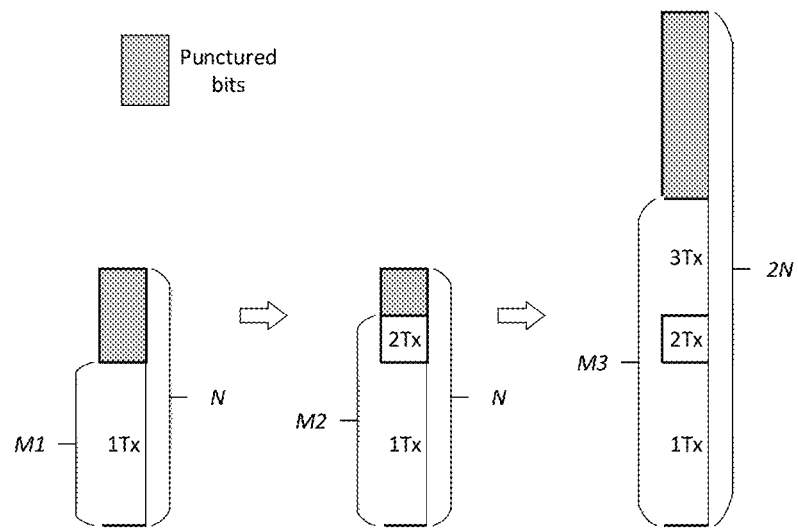
FIG. 11 IR-HARQ process with fine granularity—II.

FIG. 11 presents an IR-HARQ process, where sequentially puncturing is used for rate matching. For this case, the punctured positions will be extended in retransmissions directly (i.e., extended in the second part of the second polar code) and symmetrical puncturing is not needed. The procedure is as follows.

Figure 13:
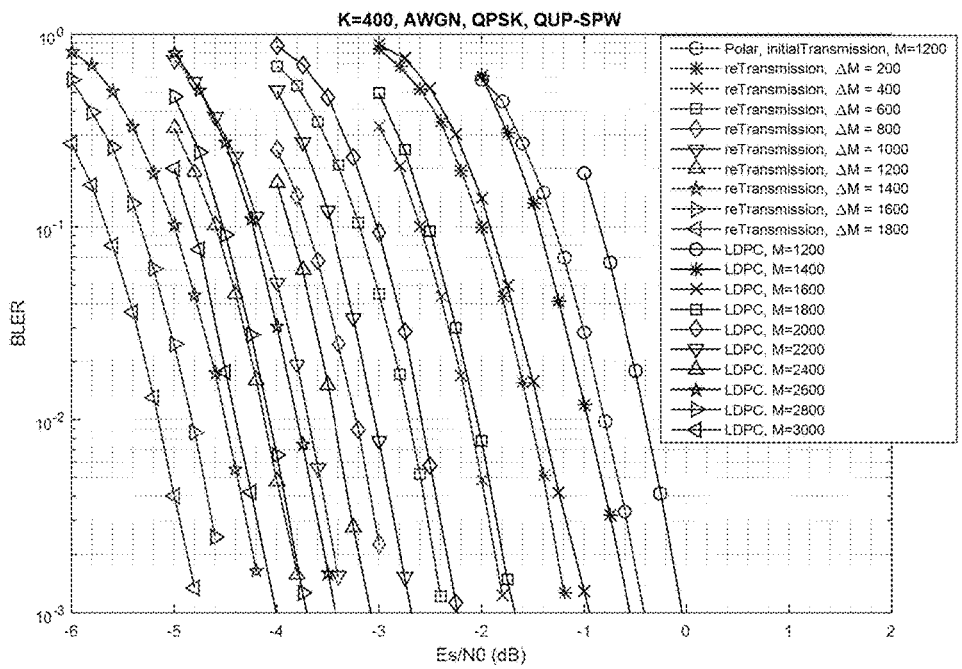
FIG. 13 Performance comparison of adaptive IR-HARQ between Polar code and LDPC code.

1) Extend the code length to the number of total bits transmitted from the initial transmission until this retransmission. In FIG. 11, the code length is extended to M2 in the $2^{nd}$ transmission and M3 in the $3^{rd}$ transmission, respectively. Extend the mother code length if necessary. In FIG. 11, the code length is extended to 2N in the $3^{rd}$ transmission, where the extended code length M3 is larger than N.
2) Puncture from head in a sequential order from the extended mother code length. In FIG. 13, the N coded bits will be punctured to M2 for the $2^{nd}$ transmission and 2N coded bits will be punctured to M3 for the $3^{rd}$ transmissions. Note here that since the puncturing is from head, the punctured positions is consistent with arbitrary code length. We can easily extend the code with a reversal order, that is, from the starting point of last transmission and extending to the head.
3) Construct the Polar code according to the extended polar code. The reliabilities of the sub-channels may be recalculated or not.
4) Only puncturing is used for rate matching in all transmissions. The LLR will be set to 0 at the decoder.

Figure 12:
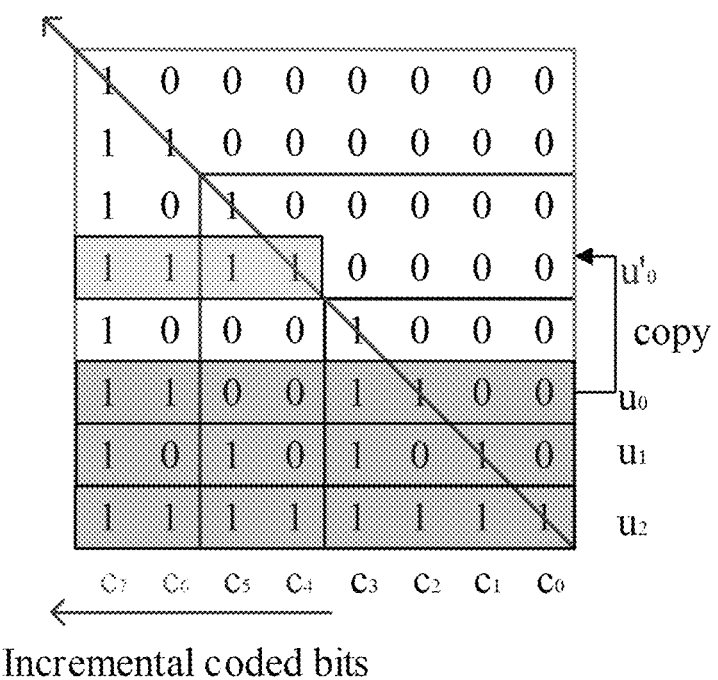
FIG. 12 IR-HARQ example with fine granularity—II.

FIG. 12 presents an IR-HARQ example. A polar code with code length of 4 and information bit length of 3 is transmitted in the initial transmission. In the initial transmission, u0, u1, u2 are information bits and the coded bits c0, c1, c2, c3 are transmitted. In the first retransmission, 2 coded bits will be transmitted. The code length is extended to 6, which is punctured from the polar code of length 8. A new information bit u0', which is more reliable than u0, is introduced in the extended part. The bit in the less reliable bit u0 is copied to the new information bit u0' and encoded with the extended code. Due to the low triangle of the generation matrix, c0, c1, c2, c3 will not be changed, and new coded bits, i.e. c4 and c5, are generated, which are incremental coded bits for the first retransmission. In the second retransmission, another 2 coded bits need to be transmitted. The code length is extended to 8, which actually recovers the 2 punctured bits in the first retransmission. Since no new information bits are introduced in the extended part, the punctured bits, i.e. c6 and c7, are directly transmitted.

The performance of this example is shown in FIG. 13. In the initial transmission, 400 information bits are encoded to 1200 bits with coding rate of ⅓. In the retransmission, the number of transmitted bits may be 200, 400, 600, and so on. As shown in FIG. 13, when different number of coded bits are transmitted in the retransmission, the performance is stable and the better more bits are transmitted. And, the performance of this adaptive IR-HARQ of polar code is better than LDPC code.

Embodiment 4: Fine Granularity Support for IR-HARQ with Chase Combining

Figure 14:
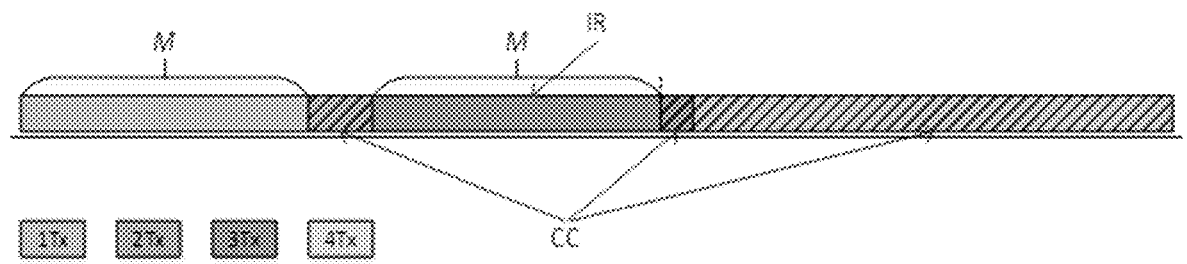
FIG. 14 An Example of Adaptive IR-HARQ for Polar Codes.

When the code length after extending in retransmission is not doubled, puncturing is needed, which may deteriorate the performance when puncturing too much (e.g., puncturing larger than ¼ of the code length). In this case, we use simple chase combining (CC) instead. When the coding rate is very low (e.g., ⅙) where little coding gain can be obtained with incremental coding, we can also use CC instead to compromise the complexity. FIG. 14 presents an example where the numbers of transmitted bits in each single (re-)transmission are quite different, which may be determined by the available resources. In this example, the code length of the 1st transmission is M and the coding rate is ⅓. In the 2nd transmission, the transmitted bits are much less than M, which will cause too much puncturing if extending the code length. Therefore, CC is used for this transmission, i.e., simply transmitting some of the coded bits in the 1st transmission. In the 3rd transmission, the transmitted bits are a little more than M. In this transmission, we first do code extension to generate M incremental coded bits, and then repeat some bits additionally for CC. It is also possible that the CC applies to the $3^{rd}$ transmission. In the 4th transmission, since the coding rate has already been ⅙ after the 3rd transmission, we simply use CC for this transmission.

Figure 15:
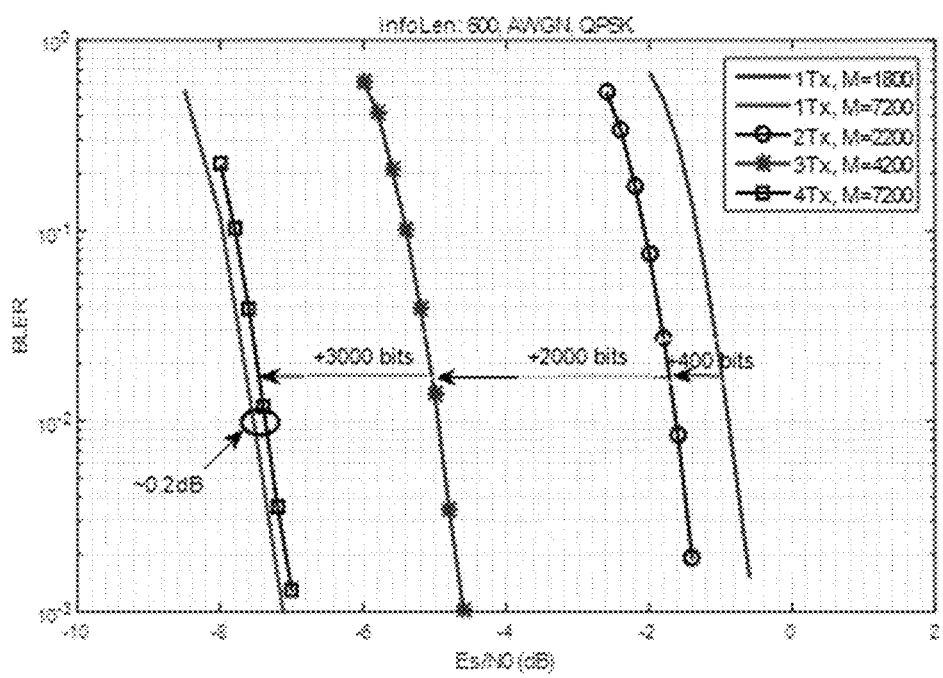
FIG. 15 Performance of Adaptive IR-HARQ for Polar Codes.

The performance of this example is shown in FIG. 15. The pink curve is the baseline, where 600 information bits are directly encoded to 7200 bits with coding rate of 1/12. As shown in FIG. 15, the performance is stable across all the retransmissions. When the number of total transmitted bits reaches 4 times of the 1st transmission, there exists about 0.2 dB performance loss compared to directly coding with rate of 1/12. This is due to the fact that repetition rather than incremental coding is used when the rate is below ⅙. However, this performance penalty leads to a lower encoding and decoding complexity and latency.

Figure 16:
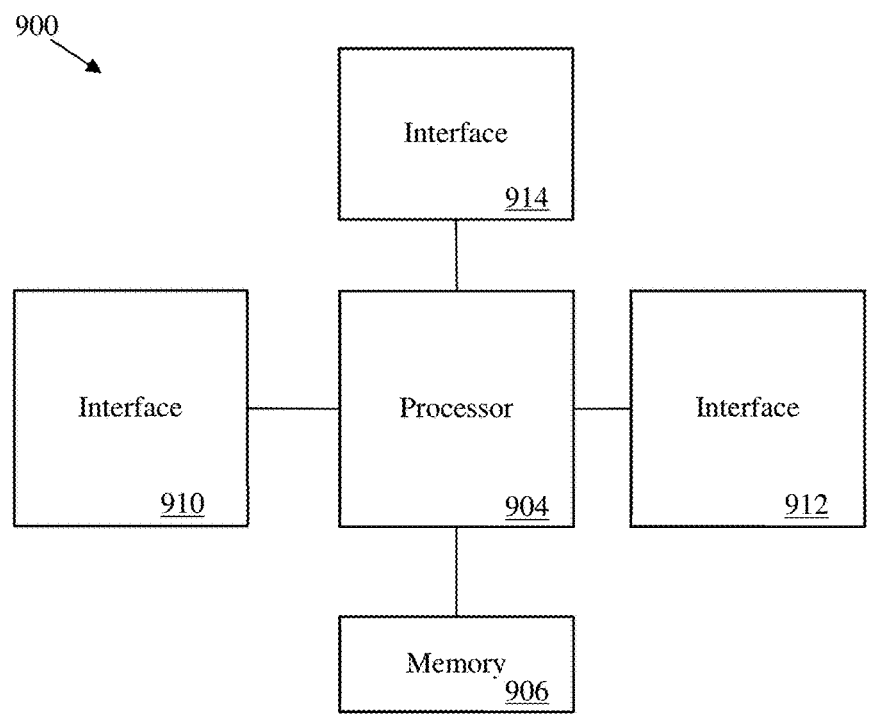
FIG. 16 illustrates a diagram of an embodiment processing system.

FIG. 16 illustrates a block diagram of an embodiment processing system 900 for performing methods described herein, which may be installed in a host device. As shown, the processing system 900 includes a processor 904, a memory 906, and interfaces 910-914, which may (or may not) be arranged as shown in FIG. 16. The processor 904 may be any component or collection of components adapted to perform computations and/or other processing related tasks, and the memory 906 may be any component or collection of components adapted to store programming and/or instructions for execution by the processor 904. In an embodiment, the memory 906 includes a non-transitory computer readable medium. The interfaces 910, 912, 914 may be any component or collection of components that allow the processing system 900 to communicate with other devices/components and/or a user. For example, one or more of the interfaces 910, 912, 914 may be adapted to communicate data, control, or management messages from the processor 904 to applications installed on the host device and/or a remote device. As another example, one or more of the interfaces 910, 912, 914 may be adapted to allow a user or user device (e.g., personal computer (PC), etc.) to interact/communicate with the processing system 900. The processing system 900 may include additional components not depicted in FIG. 9, such as long term storage (e.g., non-volatile memory, etc.).

In some embodiments, the processing system 900 is included in a network device that is accessing, or part otherwise of, a telecommunications network. In one example, the processing system 900 is in a network-side device in a wireless or wireline telecommunications network, such as a base station, a relay station, a scheduler, a controller, a gateway, a router, an applications server, or any other device in the telecommunications network. In other embodiments, the processing system 900 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

Figure 17:
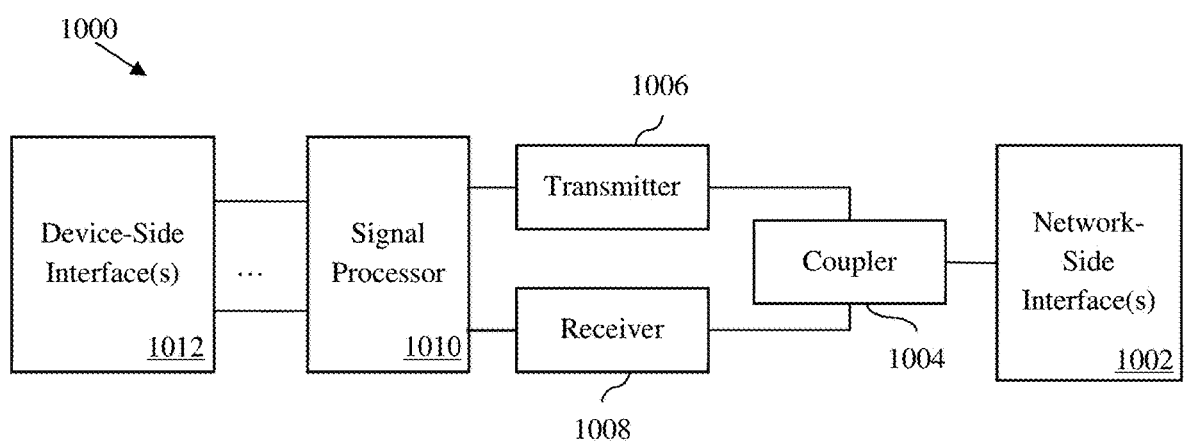
FIG. 17 illustrates a diagram of an embodiment transceiver.

In some embodiments, one or more of the interfaces 910, 912, 914 connects the processing system 900 to a transceiver adapted to transmit and receive signaling over the telecommunications network. FIG. 17 illustrates a block diagram of a transceiver 1000 adapted to transmit and receive signaling over a telecommunications network. The transceiver 1000 may be installed in a host device. As shown, the transceiver 1000 comprises a network-side interface 1002, a coupler 1004, a transmitter 1006, a receiver 1008, a signal processor 1010, and a device-side interface 1012. The network-side interface 1002 may include any component or collection of components adapted to transmit or receive signaling over a wireless or wireline telecommunications network. The coupler 1004 may include any component or collection of components adapted to facilitate bi-directional communication over the network-side interface 1002. The transmitter 1006 may include any component or collection of components (e.g., up-converter, power amplifier, etc.) adapted to convert a baseband signal into a modulated carrier signal suitable for transmission over the network-side interface 1002. The receiver 1008 may include any component or collection of components (e.g., down-converter, low noise amplifier, etc.) adapted to convert a carrier signal received over the network-side interface 1002 into a baseband signal. The signal processor 1010 may include any component or collection of components adapted to convert a baseband signal into a data signal suitable for communication over the device-side interface(s) 1012, or vice-versa. The device-side interface(s) 1012 may include any component or collection of components adapted to communicate data-signals between the signal processor 1010 and components within the host device (e.g., the processing system 900, local area network (LAN) ports, etc.).

The transceiver 1000 may transmit and receive signaling over any type of communications medium. In some embodiments, the transceiver 1000 transmits and receives signaling over a wireless medium. For example, the transceiver 1000 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 1002 comprises one or more antenna/radiating elements. For example, the network-side interface 1002 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 1000 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or operations, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or operations.

The following references are related to subject matter of the present application. Each of these references is incorporated herein by reference in its entirety: Provisional Application Ser. No. 62/402,862 filed Sep. 30, 2016 and entitled "Method and Device for Parallel Polar Code Encoding/Decoding;" Provisional Application Ser. No. 62/395,272 filed Sep. 15, 2016 and entitled "An Encoding Method for Parity Check Concatenated Polar Codes;" Provisional Application Ser. No. 62/396,618 filed Sep. 19, 2016 and entitled "Method and Device for Assigning Dynamic Frozen Bits and Constructing a Parity Function on Them in a Polar Code."

What is claimed is:

1. A method for polar encoding, the method comprising:
receiving a message comprising information bits;
encoding the message using a first polar code to obtain a first codeword;
encoding the message using a second polar code to obtain a second codeword, wherein the second codeword includes two parts, and a first part of the second codeword is same as the first codeword;
transmitting the first codeword to a receiver in a first transmission; and
transmitting a second part of the second codeword in a second transmission without transmitting a first part of the second codeword when the receiver is unable to decode the message based on the first codeword.

2. The method of claim 1, wherein a length of a second part of the second codeword is equal to a length of the first codeword.

3. The method of claim 1, wherein the first codeword includes one or more information bits that are included in a second part of the second codeword and excluded from the first part of the second codeword.

4. The method of claim 3, wherein the second part of the second codeword includes parity information for the one or more information bits that are included in the second part of the second codeword and excluded from the first part of the second codeword.

5. The method of claim 3, wherein the one or more information bits that are included in the second part of the second codeword and excluded from the first part of the second codeword are mapped to most-reliable bit-locations in the second part of the second codeword.

6. The method of claim 3, wherein the first codeword is transmitted as an original transmission, wherein the second part of the second codeword is transmitted as a re-transmission, and wherein the one or more information bits that are included in the second part of the second codeword and excluded from the first part of the second codeword are carried in more reliable bit-locations during the second transmission than during the first transmission.

7. The method of claim 1, wherein shortened and/or punctured positions in a second part of the second codeword are symmetrical and consistent with shortened and/or punctured positions in the first codeword.

8. The method of claim 1, wherein sequential puncturing is used for rate matching, and punctured positions are in the second part of the second codeword.

9. The method of claim 1, wherein the second part of the second codeword is a portion of the first codeword.

10. The method of claim 1, further comprising:
encoding the message using a third polar code to obtain a third codeword, wherein the third codeword includes three parts, a first part of the third codeword is same as the first codeword and a second part of the third codeword is same as a second part of the second codeword, and
transmitting a third part of the third codeword without transmitting the first two parts of the third codeword when the receiver is unable to decode the message based on the first codeword and the second codeword.

11. A device comprising:
a processor; and
a non-transitory computer readable storage medium storing a program, wherein the program comprises instructions which, when executed by the processor, cause the processor to perform a method comprising:
receiving a message comprising information bits;
encoding the message using a first polar code to obtain a first codeword;
encoding the message using a second polar code to obtain a second codeword, wherein the second codeword includes two parts, and a first part of the second codeword is same as the first codeword;
outputting the first codeword in a first transmission; and
outputting a second part of the second codeword in a second transmission without outputting a first part of the second codeword when the message is unable to be decoded based on the first codeword.

12. The device of claim 11, wherein a length of a second part of the second codeword is equal to a length of the first codeword.

13. The device of claim 11, wherein the first codeword includes one or more information bits that are included in a second part of the second codeword and excluded from the first part of the second codeword.

14. The device of claim 13, wherein the second part of the second codeword includes parity information for the one or more information bits that are included in the second part of the second codeword and excluded from the first part of the second codeword.

15. The device of claim 13, wherein the one or more information bits that are included in the second part of the second codeword and excluded from the first part of the second codeword are mapped to most-reliable bit-locations in the second part of the second codeword.

16. The device of claim 13, wherein the first codeword is transmitted as an original transmission, wherein the second part of the second codeword is transmitted as a re-transmission, and wherein the one or more information bits that are included in the second part of the second codeword and excluded from the first part of the second codeword are carried in more reliable bit-locations during the second transmission than during the first transmission.

17. The device of claim 11, wherein shortened and/or punctured positions in a second part of the second codeword are symmetrical and consistent with shortened and/or punctured positions in the first codeword.

18. The device of claim 11, wherein sequential puncturing is used for rate matching, and punctured positions are in the second part of the second codeword.

19. The device of claim 11, wherein the second part of the second codeword is a portion of the first codeword.

20. A non-transitory computer readable storage medium, wherein the medium is configured to store a program, wherein the program comprises instructions which, when executed by a processor cause a device to implement a method comprising:
receive a message comprising information bits;
encode the message using a first polar code to obtain a first codeword;
encode the message using a second polar code to obtain a second codeword, wherein the second codeword includes two parts, and a first part of the second codeword is same as the first codeword;

transmit the first codeword to a receiver in a first transmission; and transmit a second part of the second codeword in a second transmission without transmitting a first part of the second codeword when the receiver is unable to decode the message based on the first codeword.

* * * * *